(12) United States Patent
Lyons et al.

(10) Patent No.: US 6,605,413 B1
(45) Date of Patent: Aug. 12, 2003

(54) CHEMICAL TREATMENT TO STRENGTHEN PHOTORESISTS TO PREVENT PATTERN COLLAPSE

(75) Inventors: Christopher F. Lyons, Fremont, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/230,171

(22) Filed: Aug. 29, 2002

Related U.S. Application Data

(62) Division of application No. 09/819,819, filed on Mar. 29, 2001.

(51) Int. Cl.$^7$ .............................. G03F 7/26; G03F 7/00
(52) U.S. Cl. ...................... 430/314; 430/313; 430/325; 430/328; 430/330
(58) Field of Search ................................ 430/311, 313, 430/314, 315, 322, 324, 325, 328, 330

(56) References Cited

U.S. PATENT DOCUMENTS

| | | | | |
|---|---|---|---|---|
| 4,125,650 A | * | 11/1978 | Chiu .......................... | 427/337 |
| 4,517,227 A | | 5/1985 | Cassat ........................ | 427/96 |
| 4,826,756 A | * | 5/1989 | Orvek ......................... | 430/328 |
| 5,128,230 A | | 7/1992 | Templeton et al. ........ | 430/191 |
| 5,374,693 A | | 12/1994 | Lynch et al. ................ | 525/501 |
| 5,688,719 A | * | 11/1997 | Tsai ............................ | 437/194 |
| 6,232,417 B1 | | 5/2001 | Rhodes et al. .............. | 526/171 |

OTHER PUBLICATIONS

T. Tanaka et al., "Prevention of Resist Pattern Collapse by Flood Exposure during Rinse Process," Jpn. J. Appl. Phys. (Dec. 1994), vol. 33, Part 2, No. 12B, pp. 1803–1805. Japan Society of Applied Physics and the Physical Society of Japan.

\* cited by examiner

*Primary Examiner*—Kathleen Duda
(74) *Attorney, Agent, or Firm*—Foley & Lardner

(57) ABSTRACT

There is provided a method for forming a photoresist layer for photolithographic applications which has increased structural strength. The photoresist layer is exposed through a mask and developed. The photoresist layer is then reacted with a stabilizer agent to change its material properties before the photoresist layer is dried. Also provided are a semiconductor fabrication method employing a stabilizer-treated photoresist and a composition for a photoresist that strengthens when exposed to a stabilizer agent.

43 Claims, 9 Drawing Sheets

CHEMICAL TREATMENT TO STRENGTHEN PHOTORESISTS TO PREVENT PATTERN COLLAPSE

CROSS-REFERENCE TO RELATED PATENT APPLICATION

This application is a division of application Ser. No. 09/819,819, filed Mar. 29, 2001, now pending. This application claims only subject matter disclosed in the parent application and therefore presents no new matter.

BACKGROUND OF THE INVENTION

This invention is related generally to a method of making a semiconductor device and specifically to photolithographic methods for forming submicron features including an added process step to harden photoresist material to prevent pattern collapse.

The semiconductor industry has progressively reduced the size of components and connectors on integrated circuits in the pursuit of increased computational power and device speed. State of the art semiconductor devices are approaching the limit of feature sizes that may be formed using conventional photolithography fabrication methods. One of the limits being approached involves the minimum dimension of photoresist structures that can be used during fabrication.

Photolithography employs photoresist to create a patterned structure that protects the underlying surface from subsequent fabrication steps, such as chemical etching. There are two types of photoresists in common use, positive resists and negative resists. Positive resists are sensitized when exposed to ultraviolet light so that exposed areas will dissolve in a developer solution leaving behind unexposed areas. Negative resists are hardened by exposure to ultraviolet light so exposed areas are inhibited from being dissolved by the developer solution while unexposed areas are dissolved.

Using the example of a positive resist process, a conventional photolithography method for producing lines is illustrated in FIGS. 1A and 1B. Supported by a substrate 1 is provided a material layer that forms a surface 2 in which it is desired to form a first and second line. A positive photoresist layer 3 is formed over the surface 2. A first region 5 and a second region 7 in the photoresist layer 3 are simultaneously exposed to electromagnetic radiation 8, such as ultraviolet or actinic light, through openings 11 and 13 in a mask or reticle 9, as illustrated in FIG. 1A. The mask 9 comprises a pattern of lines of opaque material 10, which prevent transmission of light 8, and transparent openings 11, 13. The terms mask and reticle are used interchangeably in the semiconductor arts, with the term reticle often referring to a mask used in step and repeat exposure systems. The photoresist layer 3 is then developed wherein the exposed regions 5 and 7 are removed (when employing a negative resist, the unexposed areas are removed), while the unexposed region 6 remains, as illustrated in FIG. 1B. A gas or liquid etching medium is then permitted to reach the underlying surface 2 through the openings 15, 17 in the photoresist layer 3 to etch lines 16, 18 in surface 2, which are separated by an space distance 19, as illustrated in FIG. 1C.

In the developing step, the exposed areas of a positive photoresist are removed by a developer solution to leave the desired pattern image on the surface. At the end of the developing step, the surface must be rinsed to stop the developing reaction and remove the developer solution from the surface. Typical positive resist developer solutions are alkaline solutions diluted with water, which require only a water rinse. Negative resist developer solutions are organic solvents, which require rinsing with other organic solvents (e.g. n-butyl acetate). After rinsing, the substrate is dried in preparation for further processing.

Developed, rinsed and dried photoresist layers are sometimes then treated with ultraviolet radiation to reduce the tendency of the photoresist to flow during subsequent process steps where the photoresist will experience high temperatures, which may including bake cycles, plasma etching, ion implantation and ion milling. This treatment is typically accomplished by irradiating the dried photoresist layer with deep UV (e.g. <320 nm) while heating the layer to a high temperature (e.g. 120–190° C.) for approximately a minute. Alternatively, developed, rinsed and dried photoresist layers are sometimes then treated by irradiating the surface with electron beams with energies of 1–100KeV.

As the width and spacing of circuit structures is reduced, the width of the photoresist structures used to create them must be reduced. A practical limit being approached in semiconductor feature sizes results from the photoresist structures becoming so narrow with respect to the photoresist layer thickness that they lack the structural rigidity to withstand the forces induced by surface tension of liquid between them when the surface is dried. As feature sizes are reduced, the spacings between opaque regions 30 on the mask 24 are reduced, which results in exposed regions 25, 27, that are illuminated by light 28, and unexposed regions 26 both having narrow widths, as shown in FIG. 2A. When developed, the photoresist features 26 are thin to provide a narrow interline distance 34, and are closely spaced to make the photoresist openings 35, 37 narrow, as illustrated in FIGS. 2A and 2B. As illustrated in FIG. 2C, as the photoresist pattern layer dries, a meniscus 31, 32, 33 of developer or rinse solution forms in the narrow spaces 35, 37 between adjacent photoresist structures 26, 38, 39, which pulls the structures together due to surface tension. Thin structures of relatively weak photoresist material can collapse under such meniscus forces, as illustrated by photoresist structures 38 and 39, which renders the pattern on the surface unusable. Furthermore, thin photoresist structures may collapse under capillary forces of the liquid within spaces during spin developing or spin rinsing, which involves rapidly revolving a wafer while depositing a solution on the wafer near the axis of revolution so the solution is distributed over the wafer by centripetal force. Thus, the prior art methods of photolithography cannot form structures below a critical line dimension and inter-line spacing which are limited by the mechanical strength of the photoresist.

BRIEF SUMMARY OF THE INVENTION

According to one aspect of the present invention, there is provided a method of forming a photoresist layer, comprising the steps of providing a surface, depositing a photoresist layer on the surface, the photoresist layer having material properties, exposing the photoresist layer through a mask to create an exposed area of photoresist and an unexposed area of photoresist, developing the photoresist layer; and applying a stabilizing treatment to the photoresist layer while the photoresist layer is immersed in a liquid to change the material properties.

According to another aspect of the present invention, there is provided a method of making a semiconductor device, comprising the steps of forming at least one semiconductor device on a substrate, forming an insulating layer over the semiconductor device, forming a photoresist layer over the insulating layer, the photoresist layer having material properties, exposing the photoresist layer through a mask to create an area of exposed photoresist and an area of unexposed photoresist, developing the photoresist layer to form an opening in the photoresist layer, applying a stabilizing treatment to the photoresist layer while the photoresist material is immersed in a liquid to change the material properties, forming a trench in the insulating layer; and forming a conductive line in the trench. Alternatively, another aspect of the present invention comprises forming a conductive layer of conductive material on a substrate, forming a photoresist layer over the conductive layer, the photoresist layer having material properties, exposing the photoresist layer through a mask to form a line of exposed photoresist and an area of unexposed photoresist, developing the photoresist layer to remove the area of unexposed photoresist, applying a stabilizing treatment to the photoresist layer while the photoresist material is immersed in a liquid to change the material properties, remove portions of the conductive layer under the opening in the photoresist layer to form a line of conductive material on the substrate.

According to another aspect of the present invention, there is provided a semiconductor device made by using the methods described herein.

According to another aspect of the present invention, there is provided a composition for a photoresist consisting essentially of a matrix material, a sensitizer material, a solvent material, and a cross-linkable material that reacts with a stabilizing treatment to form molecular cross-links.

DETAILED DESCRIPTION OF THE INVENTION

Figure 1A:
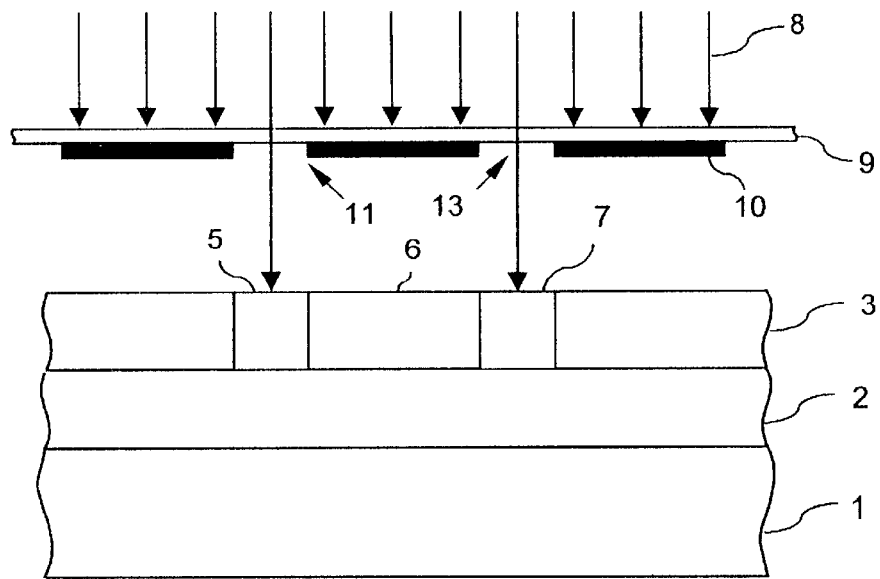
FIGS. 1A, 1B and 1C are side cross sectional views of a conventional method of making semiconductor lines.
Figure 1B:
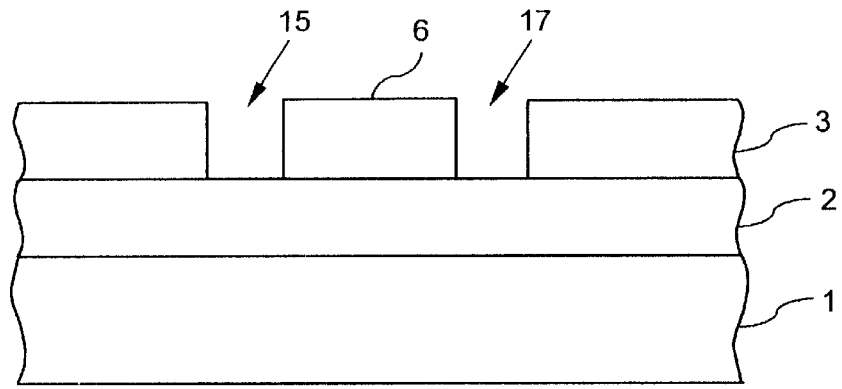
Figure 1C:
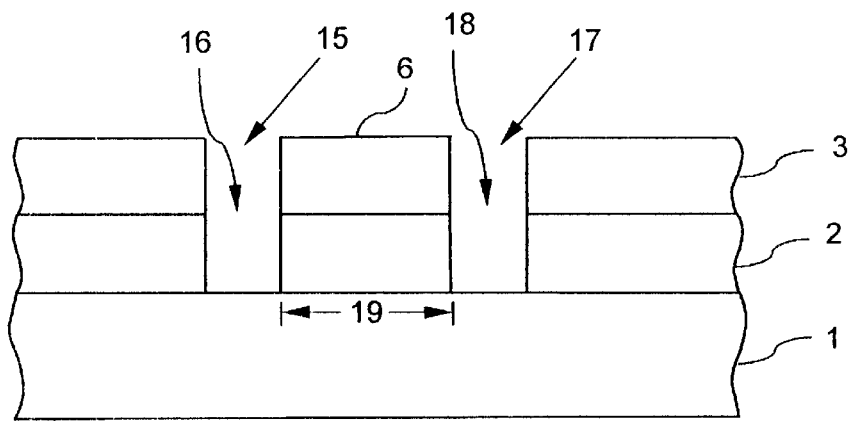
Figure 2A:
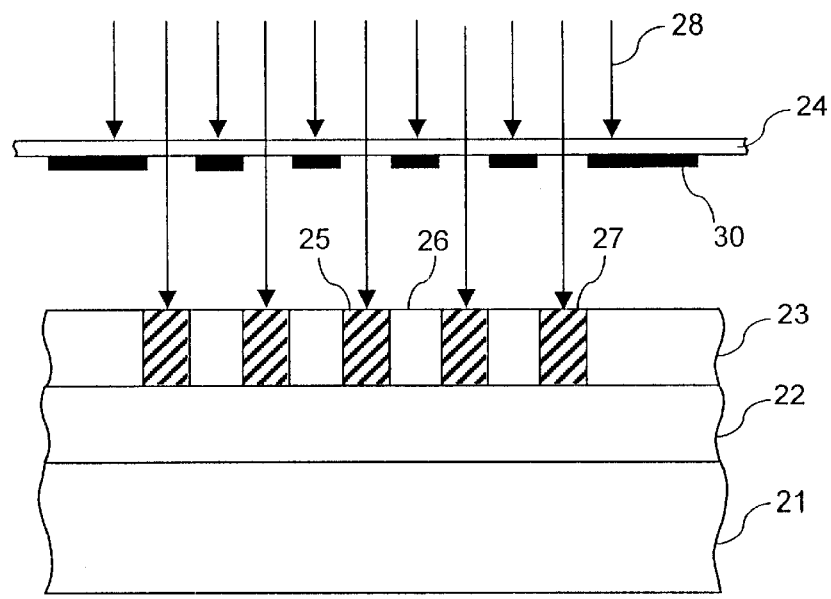
FIGS. 2A, 2B and 2C are a side cross sectional view of a conventional method of making semiconductor lines where the lines are closely spaced.
Figure 2B:
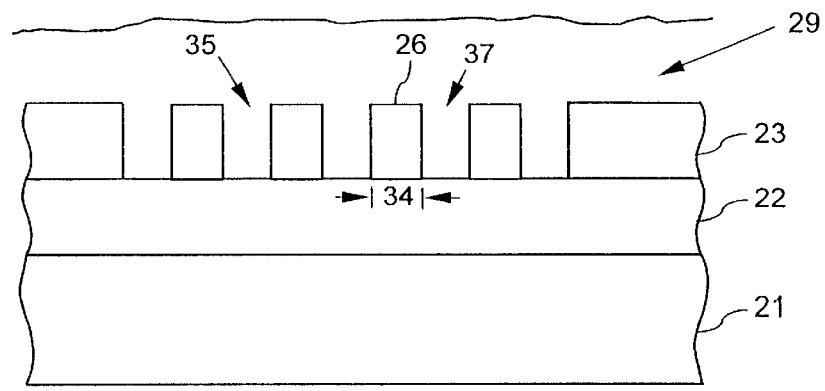
Figure 2C:
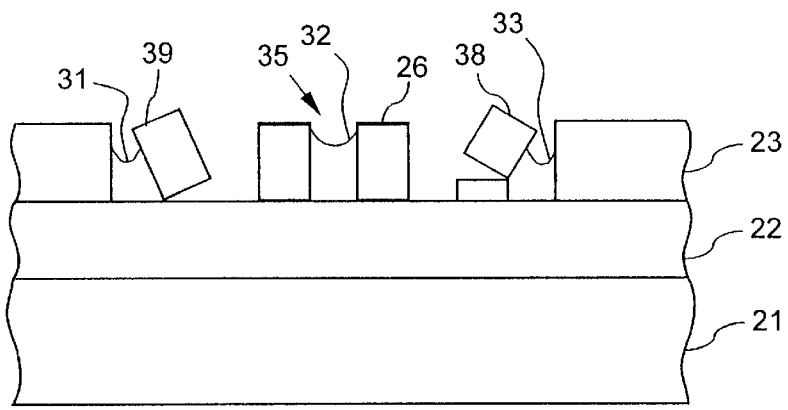

The present inventors have realized that line density may be increased and the spacing between lines may be reduced if photoresist patterns are hardened after being developed. By treating the photoresist with a material hardening treatment after developing but before the substrate is dried, photoresist features can be made strong enough to prevent deformation or collapse by liquid surface tension forces.

The problem of photoresist pattern collapse can be reduced or avoided, so that pattern dimensions can be reduced to dimensions smaller than achievable in the current state of the art, by changing the photoresist material properties to increase its strength. However, simply increasing the strength of the photoresist film before it is imaged would negatively impact its imaging performance such as photosensitivity and resolution. This problem can be reduced or avoided by chemically treating the photoresist to modify its material properties after the development step and prior to drying. Material properties, in particular mechanical strength, can be improved by causing molecular cross-links to form within and throughout the photoresist material. A cross-linkable compound may be added to the photoresist after the development step. Alternatively, cross-linkable compounds could be added to the photoresist composition that can be activated by a chemical treatment added to the developer or rinse solutions after the developing step is completed. In this invention, the favorable handling and processing properties of current photoresist compositions can be retained, while achieving the high strength of developed photoresist that is desired to prevent pattern collapse in high density semiconductor fabrication.

Positive photoresists are typically three-component materials, consisting of a matrix material, a photo-sensitive compound and a solvent. Typically, the matrix components of positive photoresists are low-molecular weight phenolic polymers, acrylic polymers or other addition polymers, that provides the photoresist layer's mechanical properties. Normally the matrix polymers contain some level of pendant acidic site precursors such as alkyl esters. The photoresist formulation also contains a photosensitive compound which upon exposure to actinic light, generates an acid. This acid catalytically cleaves the ester linkage causing the polymer to become soluble in the aqueous alkaline developer. The solvent component suspends the matrix polymer and photosensitive compound in a flowable liquid until the photoresist layer is cured with a soft-bake prior to being exposed to actinic light. Typical positive photoresist solvents include ketones, esters and alcohols, e.g., Heptanone, propylene glycol methyl ether acetate, ethyl lactate, propylene glycol methyl ether.

Negative photoresists are also three-component materials, consisting of a matrix component, a sensitizer component and a solvent. Typically, negative photoresists are comprised of the same or similar polymers and photosensitive compounds as in positive photoresists, except that they contain cross-linkable groups rather than cleavable acid protecting groups. Negative photoresist solvents are now the same as those used for positive photoresists.

The present invention solves the problem of weak photoresist material by chemically treating the photoresist after the development step to strengthen and stabilize the photoresist pattern while it is still wet. A chemical treatment referred herein as a stabilizing treatment, is applied to the photoresist while the layer is still covered by (i.e. immersed in) the developer or rinse solutions. The stabilizing treatment causes the photoresist structures to strengthen or harden before the structures are subjected to capillary forces that occur when the surface is dried.

The stabilizing treatment may be accomplished by a chemical reaction of a stabilizing treatment added to the photoresist formulation before spin coating or by diffusion of a stabilizing treatment into the already developed photoresist patterns. The diffusion into already formed patterns can be accomplished by adding it to the developer solution after developing is complete, applying it to the photoresist as a separate washing step after the developing step, or applying it to the rinse solution. The stabilizer treatment is left in contact with the photoresist long enough to achieve a desired amount of strengthening reaction. After the strengthening reaction is complete, the stabilizing treatment is rinsed off the surface to prevent contamination of subsequent semiconductor fabrication steps.

A number of chemical reaction mechanisms may be employed to formulate a stabilizing treatment that will strengthen developed photoresist. A mechanism for strengthening photoresist structures is the formation of molecular cross-links within the photoresist matrix material. Another mechanism is the lengthening of molecular cross-links already formed within the photoresist matrix material to form a more extensive, intertwined molecular structure. The stabilizing treatment may cause cross-links to form by chemically reacting with the matrix material, causing the material itself to form or grow molecular cross-links. The stabilizer treatment may be a compound that will diffuse into the photoresist; and once therein form molecular cross-links. The stabilizer material may cause photoresist constituents, such as solvent molecules, to diffuse out of the photoresist, thereby strengthening the photoresist. Subsequent process steps may also be employed to enable the stabilizer to complete the hardening process, such as irradiation with ultraviolet light or treatment with heat. All these alternative mechanisms for hardening are contemplated as preferred embodiments of the present invention.

The stabilizing treatment may cause hardening by reacting with the photoresist compounds to cause cross-links to form. Chemical reactions that may be employed to harden photoresist compounds by such a stabilizing treatment include free radical additions, nucleophilic and electrophilic additions, and condensation reactions. One example of such a stabilizing treatment is formaldehyde which causes positive photoresist to harden. Other suitable reaction-type stabilizing treatment include epoxy compounds.

The stabilizing treatment may cause hardening by reacting with the photoresist compounds to cause existing polymer chains to grow in length and cross-link or to cause existing cross-linked molecular structures to increase in degree of interconnectedness.

The stabilizing treatment may cause hardening by diffusing into and becoming a constituent of the developed photoresist. Once present in the photoresist, the stabilizing treatment may then form cross-links between stabilizing treatment molecules or cause cross-links to form between photoresist constituent molecules. The cross-linking reactions may occur spontaneously as the stabilizing treatment diffuses into the material. Alternatively, the cross-linking reactions may be stimulated after the stabilizing treatment has diffused into the material by a subsequent input of energy, such as a process step of heating or exposing the material to ultraviolet light. Chemical reactions that may be employed to form polymer chains and cross-links by such a diffusing stabilizing treatment include free radical additions, nucleophilic and electrophilic additions, and condensation reactions. Suitable diffusing stabilizing treatment include gasses and liquids, such as hexamethylcyclotrisilazane, which cause crosslinking, and diffusion of reactants from an aqueous solution such as formaldehyde.

The stabilizing treatment may cause hardening by diffusing into and becoming a constituent of the developed photoresist, and once present in the photoresist, causing the extension of existing polymer chains and cross-links. The stabilizing treatment may act by replenishing a molecule consumed in the initial polymer extension and cross-link reactions, thereby allowing the reactions to continue as long as the stabilizing treatment is present. The polymer extension and cross-linking reactions may be stimulated after the stabilizing treatment has diffused into the material by a subsequent input of energy, such as a process step of heating or exposing the material to ultraviolet light. Chemical reactions that may be employed to form polymer chains and cross-links by such a diffusing stabilizing treatment include free radical additions, nucleophilic and electrophilic additions, and condensation reactions. Diffusing stabilizing treatments may be gasses or liquids, such as hexamethylcyclotrisilazane, which cause crosslinking, and diffusion of reactants from an aqueous solution'such as formaldehyde.

In some embodiments of the present invention, a subsequent step of adding energy to the photoresist may be employed to accelerate or stimulate the polymer extension or cross-linking reaction caused be the stabilizing treatment. Reaction-enabling energy can be added to photoresist by heating or exposing the material to radiation such as ultraviolet light. The use of an additional radiation or heat treatment step may provide process advantages because they would allow controlled addition of the stabilizing treatment before the chemical reactions occur. This may be advantageous in the case of a diffusing stabilizing treatment to ensure the chemical reaction occurs throughout the photoresist material, and not just on the surface (such as forming a hardened shell around a weaker core). Also, the added energy provided by a subsequent heat or radiation treatment permits the use of endothermic reactions and thus broadening the class of compounds that may be used as stabilizing treatments.

In another preferred embodiment, a fourth component is incorporated in the photoresist that is capable of forming cross-linked molecular structures when reacted with a particular stabilizing treatment. In such a photoresist, the cross-linkable component is unaffected by the exposing and developing steps (i.e. it does not react when exposed to ultraviolet light), so it has little affect upon the process characteristics of the photoresist until it is exposed to the stabilizer agent. When exposed to the stabilizer agent, the cross-linkable component forms polymer chains and cross-links, thus strengthening and hardening the photoresist. One example of such an embodiment is an epoxy-type catalytic reaction wherein the glue component of the epoxy is incorporated into the photoresist resin and the stabilizing treatment is the catalyst. For some cross-link component-stabilizing treatment systems it may be desirable to employ a subsequent energy input step, such as heating or exposure to radiation in order to stimulate or accelerate the cross-linking reaction.

Figure 3A:
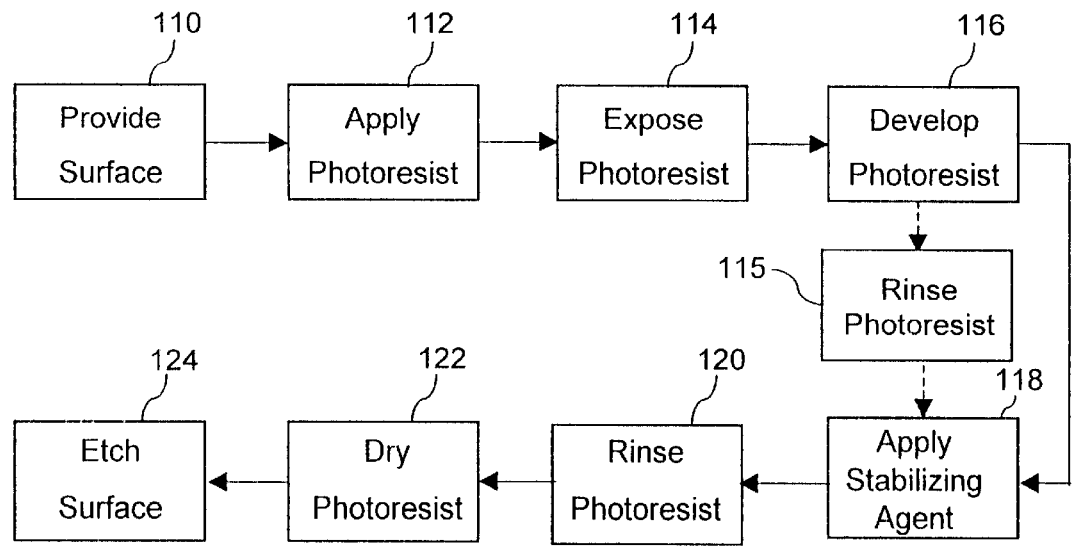
FIGS. 3A and 3B are process block diagrams of methods of making a photoresist layer.

In a preferred embodiment method diagrammed in FIG. 3A, a stabilizing treatment is employed in a semiconductor fabrication process. Among the sequence of steps required to fabricate a finished semiconductor or integrated circuit are the steps:

- providing 110 a surface to be photolithographically processed, which may involve preparing the surface with a dehydration bake and priming the surface with a pre-resist coating;
- applying 112 a layer of the positive photoresist to the surface, which may involve depositing the photoresist on the surface, such as by spin coating or vapor coating to form a uniform, adherent and defect free polymer film of the desired thickness, and performing a softbake to drive off the solvent component;
- exposing 114 the photoresist to actinic or suitable ultraviolet light shown through a mask so only selected areas (the pattern) are illuminated;

developing 116 the photoresist, such as by immersing the surface in a bath of developer solution, such as an alkaline aqueous solution, to remove exposed areas of photoresist;

applying 118 a stabilizing treatment to the photoresist layer while the photoresist layer is wet to change its mechanical properties before drying, this step may also include adding energy to the photoresist such as illuminating it with ultraviolet radiation of a particular wavelength or heating the layer to a particular temperature range for a particular duration, this step being conducted without letting the surface dry following the developing step;

rinsing 120 the photoresist layer with an aqueous solution (e.g. water) to remove the stabilizing treatment from the surface;

drying 122 the photoresist layer; and continuing on with subsequent semiconductor fabrication steps 124, such as etching the surface to form a line in the open areas in the photoresist, adding layers of insulator or conductor material, and removing the photoresist.

Figure 3B:
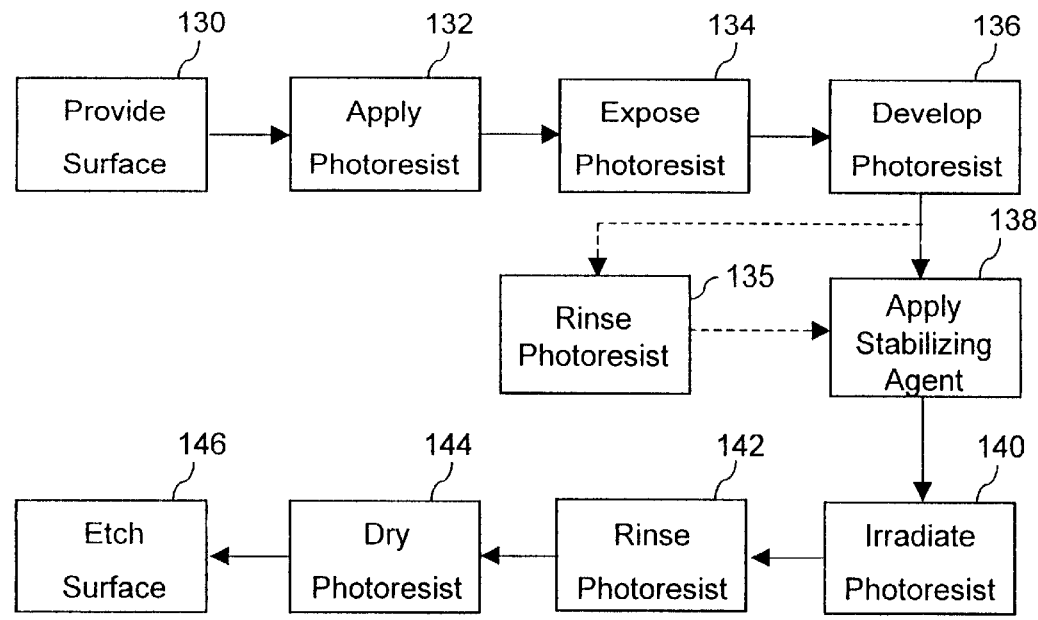

In another preferred embodiment method diagrammed in FIG. 3B, a four-component negative photoresist composition (i.e. including a cross-linkable group as the fourth component) is employed in a semiconductor fabrication process method. Among the sequence of steps required to fabricate a finished semiconductor or integrated circuit are the steps:

providing 130 a surface to be photolithographically processed, which may involve preparing the surface with a dehydration bake and priming the surface with a pre-resist coating;

applying 132 a layer of the negative photoresist to the surface, which may involve depositing the photoresist on the surface, such as by spin coating or vapor coating to form a uniform, adherent and defect free polymer film of the desired thickness, and performing a soft-bake to drive off the solvent component;

exposing 134 the photoresist to actinic light shown through a mask so only selected areas (the pattern) are illuminated;

developing 136 the photoresist, such as by immersing it in a bath of developer solution, such as a mixture of one or more of toluene, xylene and alkaline solution, to remove unexposed areas of photoresist;

applying 138 a stabilizing treatment that will enable cross-linking reactions and allowing it to diffuse into the photoresist material, this step being conducted without letting the surface dry following the developing step;

irradiate 140 all remaining areas of photoresist with actinic light to cause cross-linking reactions to continue, this step being conducted without letting the surface dry following the developing and stabilizer agent application steps;

rinsing 142 the photoresist layer with an organic solvent or alkaline solution to remove the stabilizing treatment from the surface;

drying 144 the photoresist layer; and continuing on with subsequent semiconductor fabrication steps 146, such as etching the surface to form a line in the open areas in the photoresist, adding layers of insulator or conductor material, and removing the photoresist.

Figure 4:
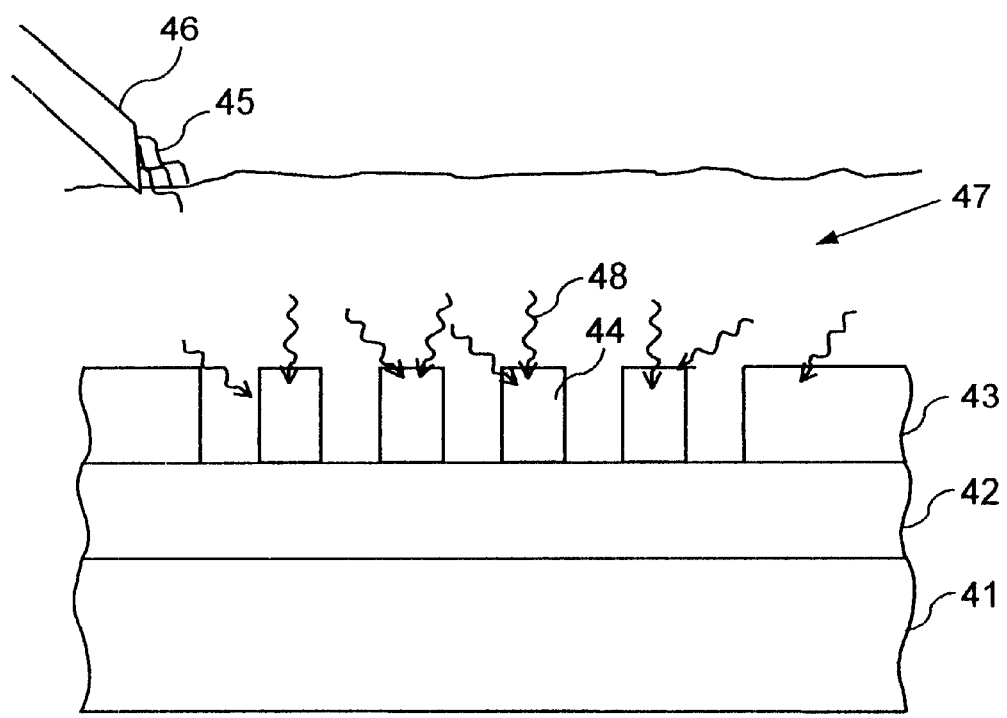
FIG. 4 is a side cross sectional view of a method of applying a stabilizing treatment to a photoresist layer.

A preferred embodiment for strengthening a positive photoresist with a stabilizer agent is illustrated in FIG. 4. A photoresist layer 43, which has been deposited upon a surface 42 layered on a substrate 41, has been exposed and developed to form structures 44. Stabilizing treatment 45, dispensed at the appropriate time and in the appropriate amounts by a dispensing mechanism 46, is added to the rinse solution 47 while the photoresist structures 44 remain immersed in the rinse solution 47. Stabilizing treatment molecules 48 then diffuse into or react with the photoresist structure 44, resulting in a cross-linking reaction that increases the material strength of the photoresist structure 44.

Figure 5A:
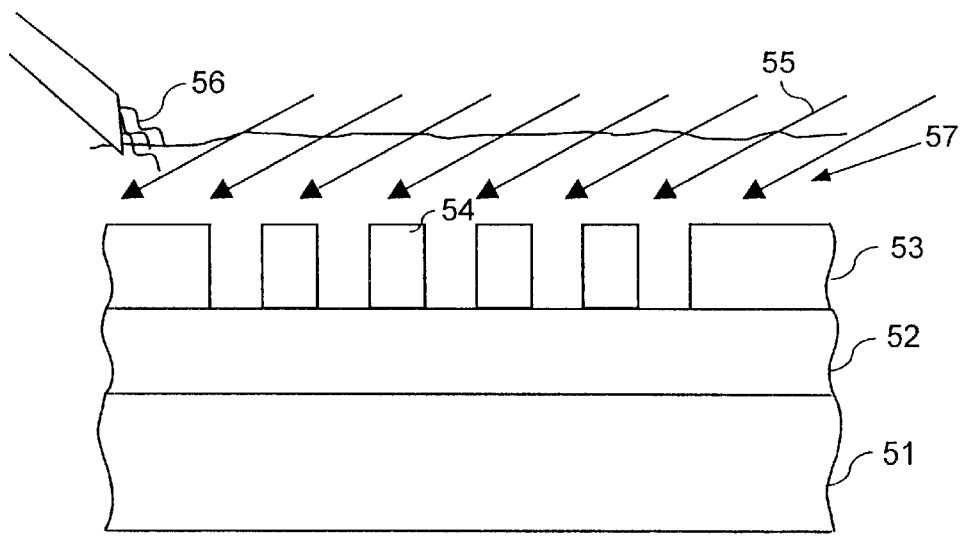
FIGS. 5A, 5B, 5C and 5D are side cross sectional view of a method of treating a photoresist layer after a stabilizing treatment has been applied.

Treating the stabilizer agent-treated photoresist layer with ultraviolet radiation may be accomplished by irradiating ultraviolet light 55 through the stabilizer agent or rinse solution 57 and onto the developed and stabilizer agent-treated photoresist 53, initiating cross-linking reactions within the photoresist structures 54, as illustrated in FIG. 5A.

Treating the stabilizer agent-treated photoresist layer with heat may be accomplished a number of ways, characterized by the heat transfer mechanisms of radiation, conduction and convection. In one preferred embodiment illustrated in FIG. 5B, the stabilizer agent-treated photoresist layer 53 may be heated directly by illuminating it through the stabilizer agent or rinse solution 57 with infrared light 59 of a particular intensity for a controlled period of time to achieve a desired temperature rise.

Figure 5B:
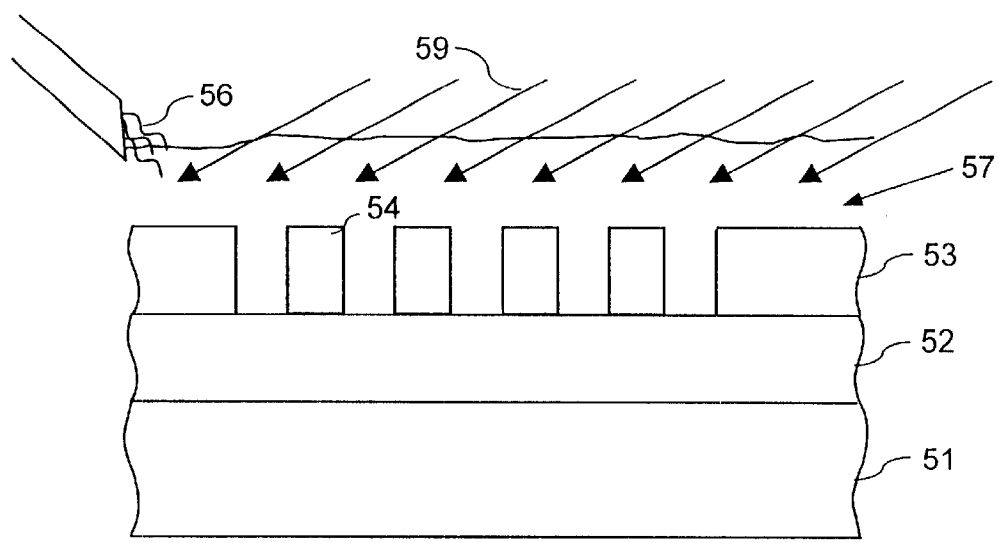
Figure 5C:
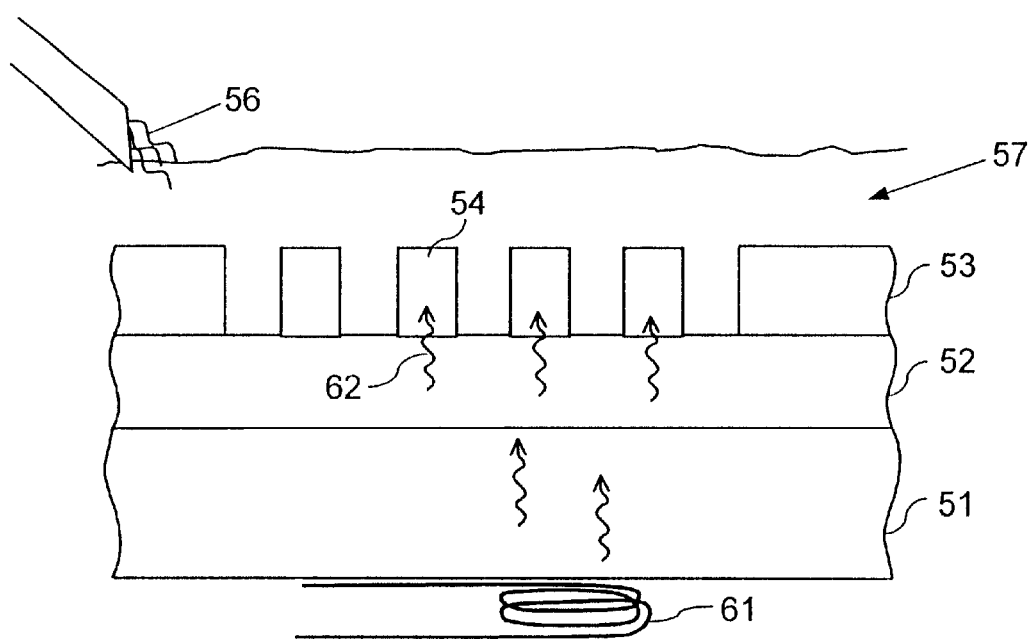
Figure 5D:
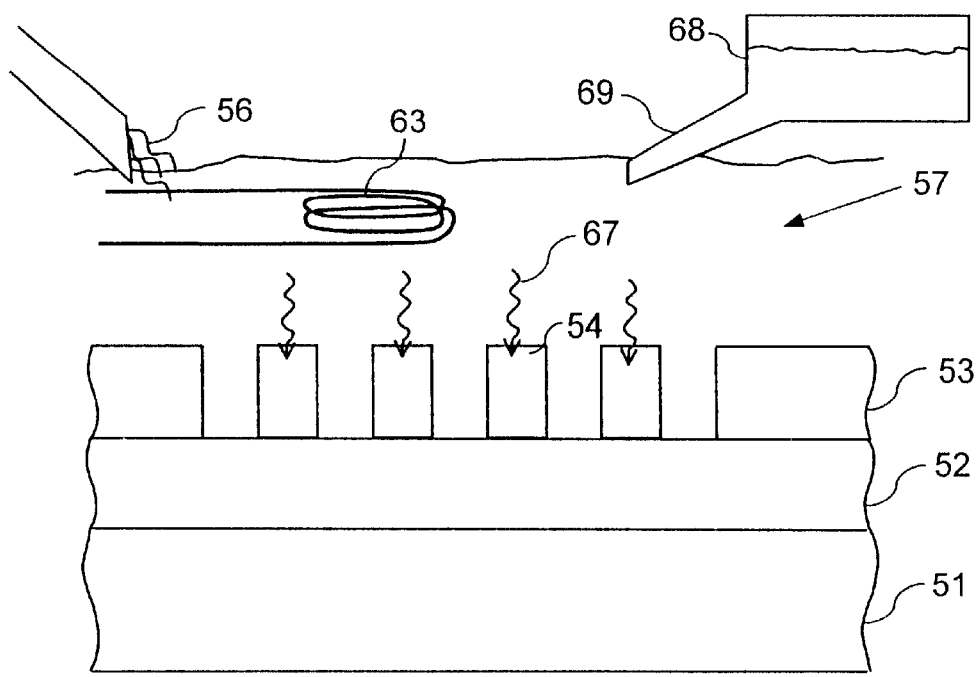

In an alternative embodiment illustrated in FIG. 5C, the substrate 51 maybe heated from underneath, such as with an electric resistive heater 61, so the heat energy 63 conducts through the substrate 51 and surface 52 into the stabilizer agent-treated photoresist material 53.

In yet another embodiment, the stabilizer agent or rinse solution 57 may be heated, such as with a resistive heater 63, so the heat energy 67 is transferred into the stabilizer agent-treated photoresist 54 by convection.

In each of the embodiments employing an energy input step (i.e. heating or irradiating) after the step of applying the stabilizing treatment it may be preferable to include a means for replenishing liquid that evaporates during the energy input step to ensure the photoresist pattern is not uncovered until the material has sufficiently strengthened to withstand the surface tension forces of a meniscus or capillary formed between adjacent photoresist structures.

The stabilizer agent may be applied to the photoresist while the layer is submerged within a bath of liquid, such as by adding it to the rinsing solution or developer solution, or as a separate bath. Alternatively, the photoresist layer may simply be wet when the stabilizing treatment is applied such that the photoresist layer is immersed within a film of liquid, such as rinsing solution or developer solution, that just covers the photoresist layer before, during and after the agent is applied. A thin layer immersion will be achieved in a spin coating process, such as applying the stabilizing treatment in a spin coating step. The term "immersed" in this application applies equally to fully submerged and to wetted with a liquid film sufficient to cover the area of the photoresist being treated. Furthermore, the stabilizing treatment may be applied only to a portion of the photoresist area, such as only those portions of an integrated circuit with high-density features, in which case only that portion of the photoresist may be immersed in the stabilizing treatment while the rest of the surface area may be allowed to dry.

Figure 6A:
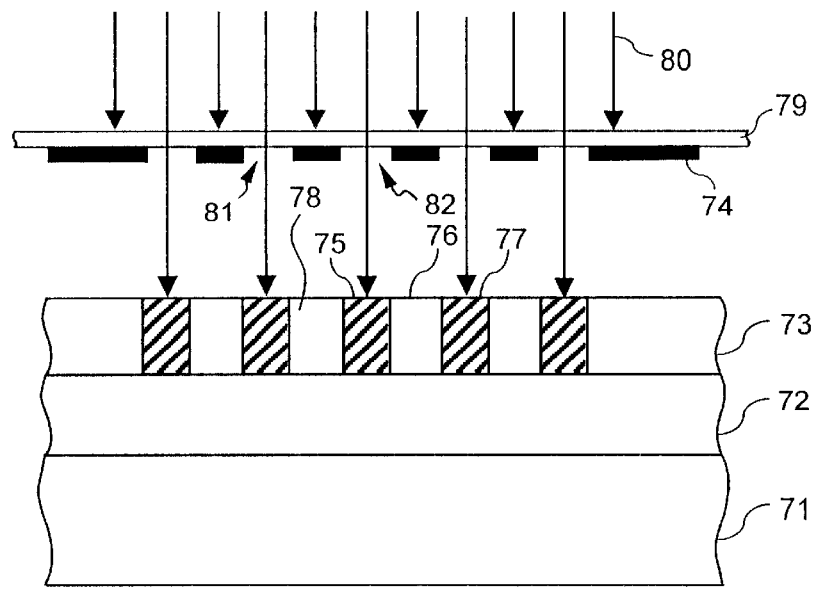
FIGS. 6A, 6B and 6C are side cross sectional views of a preferred embodiment method of making closely spaced narrow lines employing a positive photoresist.
Figure 6B:
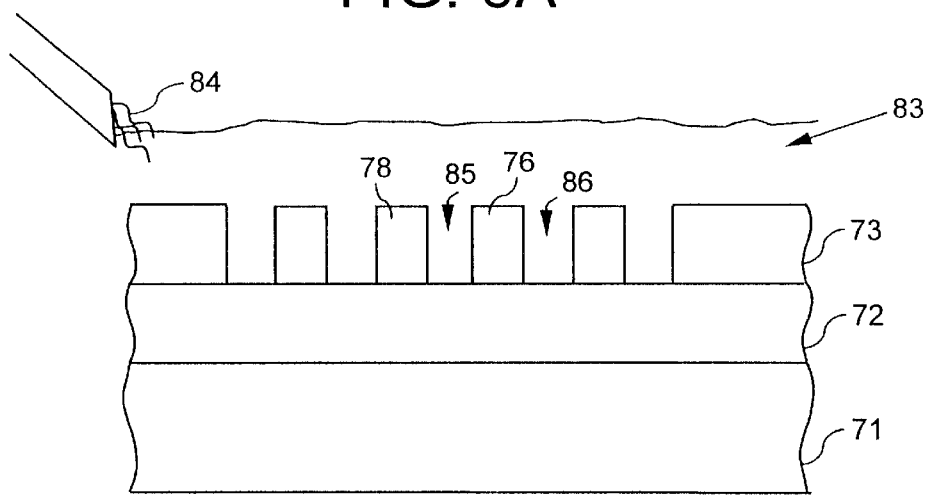
Figure 6C:
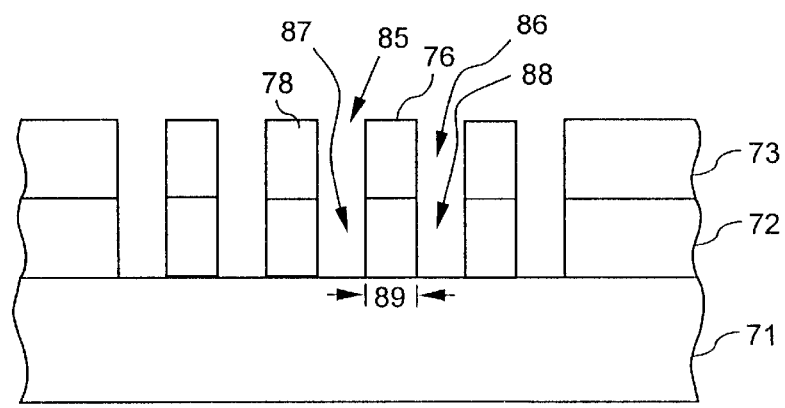

FIGS. 6A, 6B and 6C illustrate a method of forming lines using a positive photoresist according to a preferred embodiment of the present invention. A positive photoresist layer 73 is deposited on a layer that forms a surface 72 layered on a substrate 71. The photoresist layer 73 is then exposed to radiation 80, such as actinic light or other suitable UV radiation, through openings 81, 82 in the opaque pattern 74 in a mask or reticle 79 to form exposed regions 75, 77 in the photoresist layer 73, as illustrated in FIG. 5A. In this step, the exposed regions 75, 77 of the positive photoresist layer 73 are rendered soluble to developer solution. Other regions 76, 78 of the photoresist layer 73 are shielded by the opaque layer 74 of the mask 79 and are not exposed. The exposed photoresist regions 75, 77 are separated by a non-exposed region 76, which remains insoluble to the developer.

After the exposing step, the photoresist layer 73 is developed to remove the exposed photoresist regions 75, 77 from the unexposed regions 76, 78 to provide first and second openings 85, 86 to layer 73. Photoresist regions 76 and 78 are not removed during development and are used in subsequent steps to resist processes such as etching or implanting of the underlying surface 72.

As illustrated in FIG. 5B, after developing is complete, stabilizing treatment 56 is applied to the remaining positive photoresist layer 73 by being added to the rinse solution 83 to strengthen the photoresist structures by causing cross-linking reactions. Once the photoresist material has been so hardened, the surface is dried.

With openings 85 provided in the photoresist layer 73, lines 87, 88 are formed in surface 72 by providing an etching gas or an etching liquid to the surface 72 through the openings 85 in the photoresist layer 73, as illustrated in FIG. 6C. Thus, lines 87 and 88 separated by an interline region 89 are formed in surface 72, as shown in FIG. 6C.

Figure 7A:
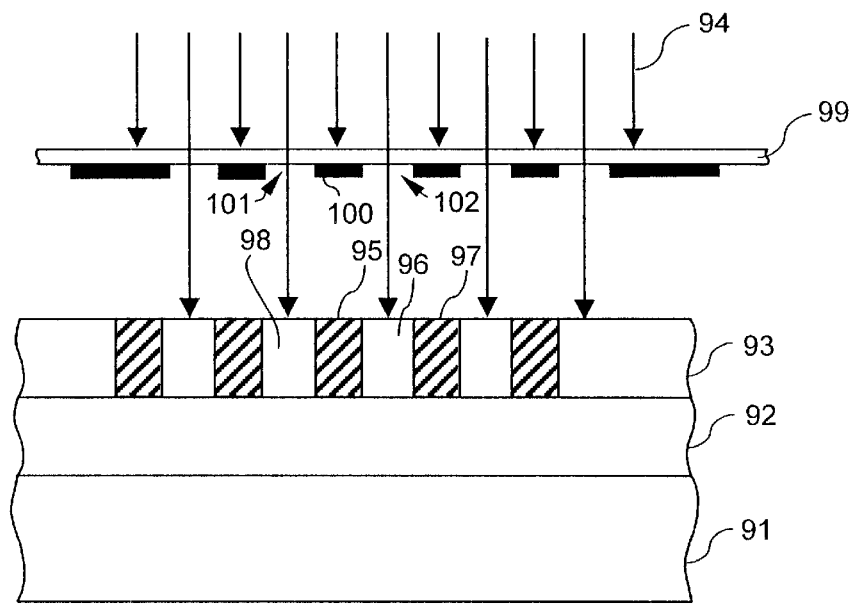
FIGS. 7A, 7B and 7C are side cross sectional views of a preferred embodiment method of making closely spaced narrow lines employing a negative photoresist.
Figure 7B:
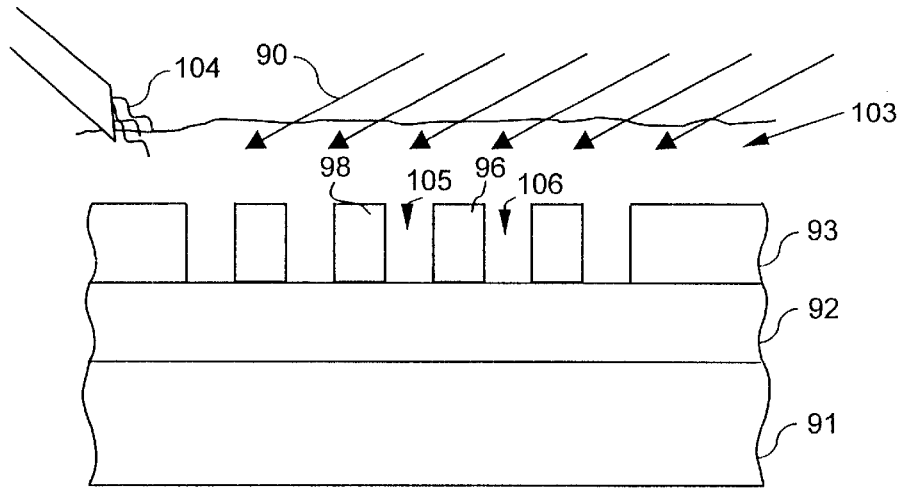
Figure 7C:
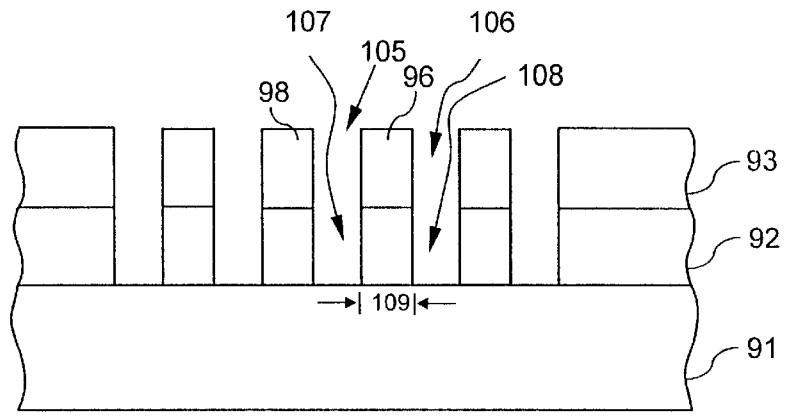

FIGS. 7A–7C illustrate a method of forming lines using a negative photoresist according to another preferred embodiment of the present invention. A negative photoresist layer 93 is deposited over a layer that forms a surface 92 layered on a substrate 91. The photoresist layer 93 is uncrosslinked and is thus developer soluble. The photoresist layer 93 is then exposed to radiation 94, such as actinic light or other suitable UV radiation, through openings 101, 102 in or opaque region 100 of a mask or reticle 99 to form exposed regions 96, 98 in the photoresist layer 93, as illustrated in FIG. 7A. The exposure to radiation 94 cross-links the photoresist in the regions within the areas 96, 98, rendering regions 96, 98 insoluble to developer solution. Regions within the areas 95, 97 are not exposed because it is shielded by an opaque region 100 of the mask 99.

After the exposure step, the photoresist layer 93 is developed to remove the uncross-linked photoresist in the unexposed regions 95, 97 to provide first and second openings 105, 106 to surface 92. Photoresist regions 96 and 98 are not removed during development and are used in subsequent steps to resist etching of the underlying surface 92.

After developing is complete, the remaining photoresist layer 93 is rinsed with a rinse solution 103 to stop the developing reaction and remove developer solution. As illustrated in FIG. 7B, while the photoresist layer 93 remains immersed in the rinse solution 103, a stabilizing treatment 104 is added which diffuses into the photoresist material 93 to enable cross-linking reactions to continue. While the photoresist layer 93 remains immersed in the rinse solution 103, the stabilizing treatment 104 or a mixture of both, the photoresist layer is illuminated with ultraviolet light 90 to stimulate the cross-linking reaction. Once the photoresist material has been so strengthened, the surface is dried.

With openings 105, 106 provided in the photoresist layer 93, lines 107, 108 are formed in layer 92 by providing an etching gas or an etching liquid to the surface 92 through the openings 105, 106 in the photoresist layer 93, as illustrated in FIG. 7C. Thus, lines 107 and 108 separated by an interline region 109 are formed in surface 92, as shown in FIG. 7C.

While FIGS. 6A–6C and 7A–7C illustrate only a few lines for ease of explanation, it should be understood that a semiconductor device contains a vast plurality of lines.

The surface 72, 92, shown in the embodiments of FIGS. 6A–6C and 7A–7C respectively, containing the lines may comprise any layer of material used in an electronic or semiconductor device, such as an insulating, metal or semiconductor layer. Preferably, surface 72, 92 comprises an insulating layer in a semiconductor device, such as a first level insulating layer or an intermetal dielectric.

Figure 8:
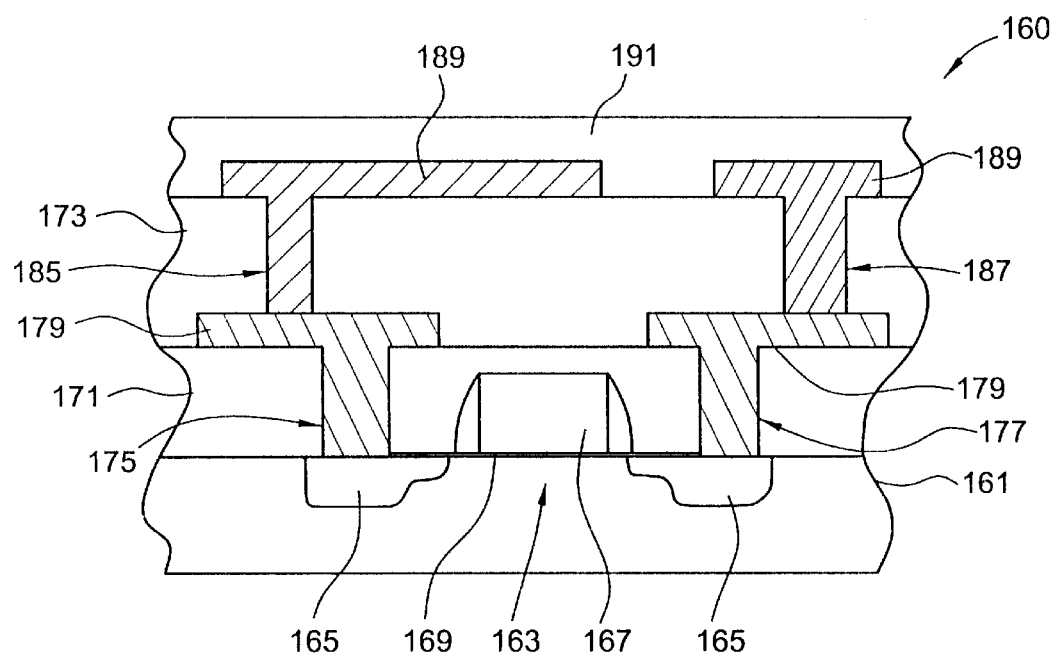
FIG. 8 is a partial side cross sectional view of a completed semiconductor device made by the method of the preferred embodiments of the present invention.

FIG. 8 illustrates a completed semiconductor device 160 containing the lines made by the methods of a preferred embodiment. The semiconductor device 160 contains a substrate 161, which may be a semiconductor (such as silicon or gallium arsenide, arsenide etc.), a glass or a plastic material. One or more active elements 163 are formed on the substrate 161. The active element may comprise at least one of a MOSFET, a MESFET, a bipolar transistor, a capacitor, a resistor or any other desired device. For example, FIG. 6 illustrates a MOSFET 163.

The MOSFET 163 contains doped source and drain regions 165 in the substrate 161, a gate electrode 167 with sidewall spacers and a gate dielectric 169 between the gate electrode and the channel region in the substrate 161. At least one insulating layer overlies the active element 163. For example, the at least one insulating layer includes a first level insulating layer 171 and a first intermetal dielectric 173, as illustrated in FIG. 8. It should be understood that there may be other plural intermetal dielectric layers above layer 173 that contain lines or vias. The insulating layers 171, 173 may comprise any dielectric layer, such as at least one of silicon oxide, silicon nitride, silicon oxynitride, fluorinated silicon oxide, aluminum oxide, tantalum oxide, BPSG, PSG, BSG and/or spin-on glass. It should be noted that the insulating layers 171, 173 may comprise plural sublayers of different dielectric materials, if desired.

The first level insulating layer 171 contains a first via 175 and a second via 177 formed using a preferred embodiment method. Conductive electrodes 179 are formed in the vias 175 and 177. The vias 175, 177 extend to the active device 163, such that the electrodes 179 contact the source and drain regions 165. The electrode material may be selected from at least one of polysilicon, aluminum, copper, tungsten, titanium, titanium nitride or metal silicide.

The first intermetal dielectric layer 173 contains a first via 185 and a second via 187 formed using a preferred embodiment method. Conductive first level interconnect metallization layers 189 are formed in the vias 185 and 187. The vias 185, 187 extend to the electrodes 179, such that the metallization layers 189 contact the electrodes 179. The metallization 189 material may be selected from at least one of polysilicon, aluminum, copper, tungsten, titanium, titanium nitride or metal silicide. A second level intermetal dielectric layer 191 overlies metallization layer 189.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

What is claimed is:

1. A method of forming a photoresist pattern, comprising the steps of:
   providing a surface;
   depositing a photoresist layer on the surface, the photoresist layer having material properties;
   exposing the photoresist layer through a mask to create an exposed area of photoresist and an unexposed area of photoresist;
   developing the photoresist layer; and
   applying a stabilizing treatment to the photoresist layer while the photoresist layer is immersed in a liquid such that the photoresist layer is totally submerged in the liquid, to change the material properties of the photoresist layer.

2. The method of claim 1, wherein the step of applying the stabilizing treatment to the photoresist layer increases the photoresist layer material strength.

3. The method of claim 2, wherein:
   the developing step comprises removing the exposed area of photoresist using a developer solution.

4. The method of claim 3, further comprising a step of rinsing the photoresist layer in a rinse solution before the step of applying a stabilizing treatment.

5. The method of claim 3, further comprising a step of rinsing the photoresist layer in a rinse solution after the step of applying a stabilizing treatment.

6. The method of claim 3 further comprising a step of heating the photoresist layer after the step of applying the stabilizing treatment.

7. The method of claim 6, wherein heating the photoresist layer is accomplished by irradiating the photoresist layer with infrared radiation.

8. The method of claim 6, wherein heating the photoresist layer is accomplished by heating the surface.

9. The method of claim 3 further comprising a step of heating the photoresist layer after the step of applying the stabilizing treatment.

10. The method of claim 4 wherein the photoresist layer includes a cross-linkable constituent and the stabilizing treatment causes the cross-linkable constituent to form cross-links.

11. The method of claim 2, wherein:
    the developing step comprises removing the unexposed area of photoresist using a developer solution.

12. The method of claim 11, further comprising a step of rinsing the photoresist layer in a rinse solution before the step of applying a stabilizing treatment.

13. The method of claim 12 wherein the photoresist layer includes a cross-linkable constituent and the stabilizing treatment causes the cross-linkable constituent to form cross-links.

14. The method of claim 11, further comprising a step of rinsing the photoresist layer in a rinse solution after the step of applying a stabilizing treatment.

15. The method of claim 11 further comprising a step of heating the photoresist layer after the step of applying the stabilizing treatment.

16. The method of claim 15, wherein heating the photoresist layer is accomplished by irradiating the photoresist layer with infrared radiation.

17. The method of claim 15, wherein heating the photoresist layer is accomplished by heating the surface.

18. The method of claim 15, wherein the step of heating the photoresist layer is accomplished by heating the rinse solution.

19. The method of claim 11 further comprising a step of heating the stabilizer agent.

20. The method of claim 6, wherein the step of heating the photoresist layer is accomplished by heating the rinse solution.

21. A method of forming a photoresist pattern, comprising the steps of:
    providing a surface;
    depositing a photoresist layer on the surface, the photoresist layer having material properties;
    exposing the photoresist layer through a mask to create an exposed area of photoresist and an unexposed area of photoresist;
    developing the photoresist layer by removing the exposed area of photoresist under a developer solution;
    applying a stabilizing treatment to the photoresist layer while the photoresist layer is immersed in a liquid to change the material properties; and
    irradiating the photoresist layer with light,
    wherein the step of applying the stabilizing treatment to the photoresist layer increases the photoresist layer material strength.

22. A method of forming a photoresist pattern, comprising the steps of:
    providing a surface;
    depositing a photoresist layer on the surface, the photoresist layer having material properties;
    exposing the photoresist layer through a mask to create an exposed area of photoresist and an unexposed area of photoresist;
    developing the photoresist layer by removing the unexposed area of photoresist under a developer solution;
    applying a stabilizing treatment to the photoresist layer while the photoresist layer is immersed in a liquid to change the material properties; and
    irradiating the photoresist layer with light,
    wherein the step of applying the stabilizing treatment to the photoresist layer increases the photoresist layer material strength.

23. A method of forming a photoresist pattern, comprising the steps of:
    providing a surface;
    depositing a photoresist layer on the surface, the photoresist layer having material properties;
    exposing the photoresist layer through a mask to create an exposed area of photoresist and an unexposed area of photoresist;
    developing the photoresist layer by removing the exposed area of photoresist under a developer solution; and
    applying a stabilizing treatment to the photoresist layer while the photoresist layer is immersed in a liquid to change the material properties,
    wherein the step of applying the stabilizing treatment to the photoresist layer increases the photoresist layer material strength, and
    wherein the stabilizing treatment includes one or more of formaldehyde or hexamethylcyclotrisilazane.

24. A method of making a semiconductor device, comprising the steps of:
    forming at least one semiconductor device on a substrate;
    forming an insulating layer over the semiconductor device;
    forming a photoresist layer over the insulating layer, the photoresist layer having material properties;

exposing the photoresist layer through a mask to create an area of exposed photoresist and an area of unexposed photoresist;

developing the photoresist layer to form an opening in the photoresist layer;

applying a stabilizing treatment to the photoresist layer while the photoresist layer is immersed in a liquid such that the photoresist layer is totally submerged in the liquid, to change the material properties of the photoresist layer;

forming a line in the insulating layer; and forming a conductive layer in the line.

25. The method of claim 24, wherein the step of applying the stabilizing treatment increases the photoresist layer material strength.

26. The method of claim 25, wherein the developing step comprises immersing the photoresist layer in a developer solution.

27. The method of claim 26, further comprising the step of rinsing the photoresist layer in a rinse solution before the step of applying the stabilizing treatment.

28. The method of claim 27 wherein the photoresist layer includes a cross-linkable constituent and the stabilizing treatment causes the cross-linkable constituent to form cross-links.

29. The method of claim 26, further comprising the step of rinsing the photoresist layer in a rinse solution after the step of applying the stabilizing treatment.

30. The method of claim 24 further comprising a step of heating the photoresist layer after the step of applying the stabilizing treatment.

31. The method of claim 30, wherein heating the photoresist layer is accomplished by irradiating the photoresist layer with infrared radiation.

32. The method of claim 30, wherein heating the photoresist layer is accomplished by heating the insulating layer.

33. The method of claim 30 further comprising a step of heating the stabilizer agent.

34. The method of claim 30 further comprising the step of rinsing the photoresist layer in a rinse solution after the step of applying the stabilizing treatment, and wherein the step of heating the photoresist layer is accomplished by heating the rinse solution.

35. The method of claim 24, wherein the step of forming the opening in the photoresist layer comprises removing the exposed area of the photoresist.

36. The method of claim 23, wherein the step of forming the opening in the photoresist layer comprises removing the unexposed area of the photoresist layer without removing the exposed area of the photoresist layer.

37. The method of claim 24, wherein:

the substrate comprises a semiconductor, a glass or a plastic material;

the insulating layer comprises at least one of silicon oxide, silicon nitride, silicon oxynitride, fluorinated silicon oxide, aluminum oxide, tantalum oxide, BPSG, PSG, BSG or spin-on glass;

the conductive layers comprise at least one of polysilicon, aluminum, copper, tungsten, titanium, titanium nitride or metal silicide; and the at least one semiconductor device comprises at least one of a MOSFET, a MESFET, a bipolar transistor, a capacitor or a resistor.

38. The method of claim 24, wherein the line extends to the at least one semiconductor device or to a second conductive layer above the at least one semiconductor device.

39. The method of claim 24 wherein the photoresist layer includes a cross-linkable constituent and the stabilizing treatment causes the cross-linkable constituent to form cross-links.

40. A method of making a semiconductor device, comprising the steps of:

forming at least one semiconductor device on a substrate;

forming an insulating layer over the semiconductor device;

forming a photoresist layer over the insulating layer, the photoresist layer having material properties;

exposing the photoresist layer through a mask to create an area of exposed photoresist and an area of unexposed photoresist;

developing the photoresist layer to form an opening in the photoresist layer;

applying a stabilizing treatment to the photoresist layer while the photoresist layer is immersed in a liquid to change the material properties;

irradiating the photoresist layer with light;

forming a line in the insulating layer; and forming a conductive layer in the line.

41. The method of claim 40, wherein the light used to irradiate the photoresist layer is ultraviolet light.

42. A method of making a semiconductor device, comprising the steps of:

forming at least one semiconductor device on a substrate;

forming an insulating layer over the semiconductor device;

forming a photoresist layer over the insulating layer, the photoresist layer having material properties;

exposing the photoresist layer through a mask to create an area of exposed photoresist and an area of unexposed photoresist;

developing the photoresist layer to form an opening in the photoresist layer;

applying a stabilizing treatment to the photoresist layer while the photoresist layer is immersed in a liquid to change the material properties;

forming a line in the insulating layer; and forming a conductive layer in the line, wherein the stabilizing treatment includes one or more of formaldehyde or hexamethylcyclotrisilazane.

43. A method of making a semiconductor device, comprising the steps of:

forming at least one semiconductor device on a substrate;

forming a conductive layer of conductive material on the substrate;

forming a photoresist layer over th conductive layer, the photoresist layer having material properties;

exposing the photoresist layer through a mask to create an area of exposed photoresist and an area of unexposed photoresist;

developing the photoresist layer to form an opening in the photoresist layer;

applying a stabilizing treatment to the photoresist layer while the photoresist layer is immersed in a liquid such that the photoresist layer is totally submerged in the liquid, to change the material properties of the photoresist layer; and removing the conductive layer under the opening in the photoresist layer to form a line of conductive material.

* * * * *